United States Patent
Misu et al.

(10) Patent No.: US 8,618,403 B2
(45) Date of Patent: Dec. 31, 2013

(54) TONE CONTROL APPARATUS

(75) Inventors: Yoshio Misu, Osaka (JP); Hiroyuki Fukuma, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 107 days.

(21) Appl. No.: 13/311,348

(22) Filed: Dec. 5, 2011

(65) Prior Publication Data
US 2012/0180620 A1 Jul. 19, 2012

(30) Foreign Application Priority Data

Jan. 13, 2011 (JP) .................................. 2011-005103
Apr. 7, 2011 (JP) .................................. 2011-085827

(51) Int. Cl.
*G10H 1/46* (2006.01)
*H03G 3/00* (2006.01)

(52) U.S. Cl.
USPC ................... 84/633; 84/615; 84/622; 84/653; 84/659; 84/665; 381/98; 381/101; 381/102; 381/104

(58) Field of Classification Search
None
See application file for complete search history.

(56) References Cited

U.S. PATENT DOCUMENTS

| | | | | |
|---|---|---|---|---|
| 3,875,334 A | * | 4/1975 | Hilbert et al. | ................... 381/98 |
| 4,701,957 A | * | 10/1987 | Smith | ............................. 381/61 |
| 4,912,424 A | | 3/1990 | Nicola et al. | |
| 5,255,324 A | | 10/1993 | Brewer et al. | |
| 5,541,998 A | * | 7/1996 | Kutner et al. | ................... 381/77 |
| 5,585,588 A | * | 12/1996 | Tumura | ........................... 84/726 |
| 6,350,943 B1 | * | 2/2002 | Suruga et al. | ................... 84/603 |
| 2005/0122162 A1 | | 6/2005 | Ishizaki | |
| 2006/0153405 A1 | | 7/2006 | Myers | |
| 2009/0161883 A1 | * | 6/2009 | Katsianos | ........................ 381/57 |
| 2012/0180620 A1 | * | 7/2012 | Misu et al. | ....................... 84/622 |
| 2012/0250895 A1 | * | 10/2012 | Katsianos | ...................... 381/107 |
| 2013/0163784 A1 | * | 6/2013 | Tracey et al. | .................. 381/103 |

FOREIGN PATENT DOCUMENTS

| | | |
|---|---|---|
| EP | 1 544 996 A1 | 6/2005 |
| EP | 1 681 765 A1 | 7/2006 |
| JP | 02-079506 | 3/1990 |
| JP | 03-030506 | 2/1991 |
| JP | 2003-142970 | 5/2003 |
| JP | 2010-109845 | 5/2010 |
| WO | 2005/109635 A1 | 11/2005 |

OTHER PUBLICATIONS

Partial European Search Report for corresponding European Application No. 11194640.6 dated Apr. 24, 2013.
European Search Report for corresponding European Application No. 11194640.6 issued Sep. 11, 2013.

* cited by examiner

*Primary Examiner* — Marlon Fletcher
(74) *Attorney, Agent, or Firm* — Renner, Otto, Boisselle & Sklar, LLP

(57) ABSTRACT

When a signal representing a first set value or more is received from a detecting section, a determination is made whether a boost value is a predetermined value or more. When the boost value is the predetermined value or more, a currently set boost value is reduced by a predetermined step, so that a new boost value is set. Further, when the boost value is less than the predetermined value, a currently set volume level is reduced by a predetermined step, and a new volume level is set. Therefore, in a case when the set boost value is gradually reduced and the boost value is finally less than the predetermined value, the audio signal is still the first set value or more, the volume level is further reduced by each predetermined step. Therefore, an audio signal can be securely prevented from being clipped.

8 Claims, 7 Drawing Sheets

TONE CONTROL APPARATUS

BACKGROUND OF THE INVENTION

1. Field of the Invention

The present invention relates to a tone control apparatus for executing a boost process on a predetermined band of a signal.

2. Description of the Related Art

Audio devices employ tone control apparatuses for executing a tone control process such as a boost process for increasing levels of predetermined frequency bands. In the boos process, as shown in FIGS. 7B and 7C, when an amplitude value of an audio signal is large, an audio signal in a boost band is in a clip state at a supply voltage, and thus an audio output from a speaker is distorted.

In order to solve this problem, applicants propose a tone control apparatus described in JP publication number 2010-109845. In this tone control apparatus, a first detecting section and a second detecting section detect a case where an output voltage of an amplifying section has a first set value or more and a case where the output voltage has less than a second set value. That is to say, a case where the output voltage of the amplifying section is clipped to a high-level side, and a case where the output voltage is clipped to a low-level side are detected. A synthesizing section synthesizes these detected results, and a switching section switches a boost amount of a boost processing section based on an output voltage of the synthesizing section. Therefore, when the output voltage of the amplifying section is clipped to the high-level side and clipped to the low-level side, the boost amount is switched into a second boost value smaller than a normal first boost value. For this reason, the output voltage of the amplifying section can be prevented from being clipped without reducing an amplitude of all bands.

In this tone control apparatus, however, even when the boost amount is switched into the second boost value, if a volume level is high, the output voltage of the amplifying section is occasionally clipped.

SUMMARY OF THE INVENTION

It is an object of the present invention to provide a tone control apparatus for securely preventing clip of an amplified signal.

A tone control apparatus of the preferred embodiment of the present invention comprises: a volume adjusting section for adjusting a volume level of an audio signal to a volume level set by a control section; a boost processing section for executing a boost process so that a boost band of the audio signal has a boost value set by the control section; an amplifying section for amplifying the audio signal via the volume adjusting section and the boost processing section; a detecting section for detecting whether the audio signal output from the amplifying section has a first set value or more, and when the audio signal has the first set value or more, outputting a signal representing that the audio signal has the first set value or more to the control section; and the control section for, when receiving the signal representing that the audio signal has the first set value or more from the detecting section, determining whether the set boost value is a predetermined value or more, and when the set boost value is the predetermined value or more, reducing the currently set boost value by a predetermined step so as to set a new boost value, and when the set boost value is less than the predetermined value, reducing the currently set volume level by a predetermined step so as to set a new volume level.

When a signal representing a first set value or more is received from a detecting section, a determination is made whether a boost value is a predetermined value or more. When the boost value is the predetermined value or more, a currently set boost value is reduced by a predetermined step, so that a new boost value is set. Therefore, when the detecting section detects that an audio signal has the first set value or more, the boost value to be set is reduced by each predetermined step, and thus clip can be prevented in advance. Further, when the boost value is less than the predetermined value, a currently set volume level is reduced by a predetermined step, and a new volume level is set. Therefore, in a case when the set boost value is gradually reduced and the boost value is finally less than the predetermined value, the audio signal is still the first set value or more, the volume level is further reduced by each predetermined step. Therefore, an audio signal can be securely prevented from being clipped.

Preferably, when the control section receives the signal representing that the audio signal has the first set value or more from the detecting section continuously for predetermined time, the control section determines whether the set boost value is a predetermined value or more.

Preferably, when the control section receives the signal representing that the audio signal has the first set value or more from the detecting section, the control section determines whether the set boost value is 0, and when the set boost value is not 0, the control section reduces the currently set boost value by a predetermined step so as to set a new boost value, and when the currently set boost value is 0, reduces the currently volume level by a predetermined step so as to set a new volume level.

Preferably, the detecting section further detects whether the audio signal output from the amplifying section has less than a second set value smaller than the first set value, and when the audio signal has less than the second set value, the detecting section outputs a signal representing that the audio signal has less than the second set value to the control section, when the control section receives the signal representing that the audio signal has less than the second set value from the detecting section, the control section determines whether the set boost value is a predetermined value or more, and when the set boost value is the predetermined value or more, the control section reduces the currently set boost value by a predetermined step so as to set a new boost value, and when the set boost value is less than the predetermined value, the control section reduces the currently set volume level by a predetermined step so as to set a new volume level.

Preferably, when the control section receives the signal representing that the audio signal has less than the second set value from the detecting section, the control section determines whether the set boost value is 0, when the set boost value is not 0, the control section reduces the currently set boost value by a predetermined step so as to set new boost value, and when the set boost value is 0, the control section reduces the currently set volume level by a predetermined step so as to set a new volume level.

Preferably, when the control section reduces the boost value currently set by a user's operation by the predetermined step so as to set the new boost value, the control section stores the boost value set by the user's operation in a storage section, and when the control section reduces the volume level currently set by the user's operation by the predetermined step so as to set the new volume level, the control section stores the volume level set by the user's operation in the storage section, and when the currently input audio signal is not input, the control section brings the boost value and the volume level stored in the storage section back to a setting state.

When the currently input audio signal is not input, occasionally clip does not occur. In this case, the original boost value and volume level can be automatically restored without a user's operation.

A tone control apparatus of the preferred embodiment of the present invention comprises: a volume adjusting section for adjusting a volume level of an audio signal to a volume level set by a control section; a boost processing section for executing a boost process so that a boost band of the audio signal has a boost value set by the control section; an amplifying section for amplifying the audio signal via the volume adjusting section and the boost processing section; a detecting section for detecting whether the audio signal output from the amplifying section has less than a second set value, and when the audio signal has less than the second set value, outputting a signal representing that the audio signal has less than the second set value to the control section; and the control section, for when receiving the signal representing that the audio signal has less than the second set value, determining whether the boost value is a predetermined value or more, and when the set boost value is the predetermined value or more, reducing the currently set boost value by a predetermined step so as to set a new boost value, and when the set boost value is less than the predetermined value, reducing the currently set volume level by a predetermined step so as to set a new volume level.

A tone control apparatus of the preferred embodiment of the present invention comprises: a volume adjusting section for adjusting a volume level of an audio signal to a volume level set by a control section; a boost processing section for executing a boost process so that a boost band of the audio signal has a boost value set by the control section; an amplifying section for amplifying the audio signal via the volume adjusting section and the boost processing section; a detecting section for detecting whether the audio signal output from the amplifying section has a first set value or more, and when the audio signal has the first set value or more, outputting a signal representing that the audio signal has the first set value or more to the control section; and the control section for, when receiving the signal representing that the audio signal has the first set value or more, determining whether the set boost value is 0, and when the set boost value is not 0, reducing the currently set boost value by a predetermined step so as to set a new boost value, and when the set boost value is 0, reducing the currently set volume level by a predetermined step so as to set a new volume level.

DETAILED DESCRIPTION OF THE PREFERRED EMBODIMENTS

Figure 1:
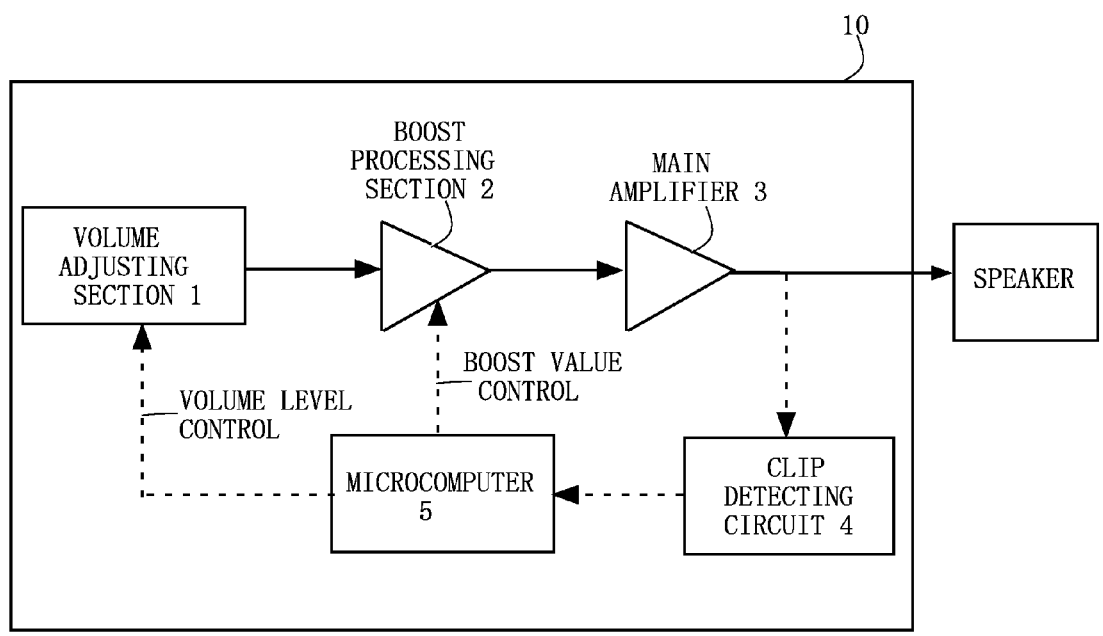
FIG. 1 is a block diagram illustrating a tone control apparatus according to a preferred embodiment of the present invention.

Preferred embodiments of the present invention will be concretely described below with reference to the drawing, but the present invention is not limited to the embodiments. FIG. 1 is a block diagram illustrating a tone control apparatus 10 according to a preferred embodiment of the present invention. The tone control apparatus 10 has a volume adjusting section 1, a boost processing section 2, a main amplifier 3, a clip detecting circuit (a detecting section) 4, and a microcomputer (a control section) 5. The volume adjusting section 1, the boost processing section 2, and the main amplifier 3 are realized by DSP, for example.

An audio signal is input into the volume adjusting section 1, and the volume adjusting section 1 adjusts a volume level of the audio signal so as to output the audio signal to the boost processing section 2. The volume level is controlled according to an instruction from the microcomputer 5. The volume level can be set by a user's operation, and thus can be set according to 50 steps (1 to 50) one step by one step, for example.

The boost processing section 2 executes an amplifying process (hereinafter, a boost process) on a predetermined frequency band (hereinafter, a boost band) of an audio signal supplied from the volume adjusting section 1, and outputs the audio signal to the main amplifier 3. The boost band is, for example, 80 Hz in a case of SBASS, and is 100 Hz in a case of BASS. A boost amount is controlled according to an instruction from the microcomputer 5. A boost value can be set by a user's operation, and can be set according to 6 steps (0, 1, 2, 3, 4 and 5), one step by one step, for example. For example, the boost value is 2 dB per 1 step. The state that the boost value is 0 means that the boost process is cancelled by a user's operation.

The main amplifier 3 executes an amplifying process on the audio signal supplied from the boost processing section (namely, by way of the volume adjusting section 1 and the boost processing section 2), and outputs the audio signal (an output voltage) to a speaker and the clip detecting circuit 4.

The clip detecting circuit 4 detects an amplitude value of the audio signal supplied from the main amplifier 3, and when the audio signal is clipped, it outputs a signal representing that the clip is carried out to the microcomputer 5. The clip detecting circuit 4 detects whether the amplitude value of the audio signal is a first set value or more, and when it is the first set value or more, the clip detecting circuit 4 outputs a signal representing that the amplitude value is the first set value or more to the microcomputer 5. On the other hand, when the amplitude value is less than the first set value, the clip detecting circuit 4 outputs a signal representing that the amplitude value is less than the first set value.

Preferably, when the amplitude value of the audio signal is less than the first set value and is a second set value (the second set value is smaller than the first set value) or more, the clip detecting circuit 4 determines that the audio signal is not clipped, and outputs a signal representing that the audio signal is not clipped to the microcomputer 5. On the other hand, when the amplitude value of the audio signal is the first set value or more, or is less than the second set value, the clip detecting circuit 4 determines that the audio signal might be clipped, and outputs a signal representing that the audio signal is clipped to the microcomputer 5.

Figure 2:
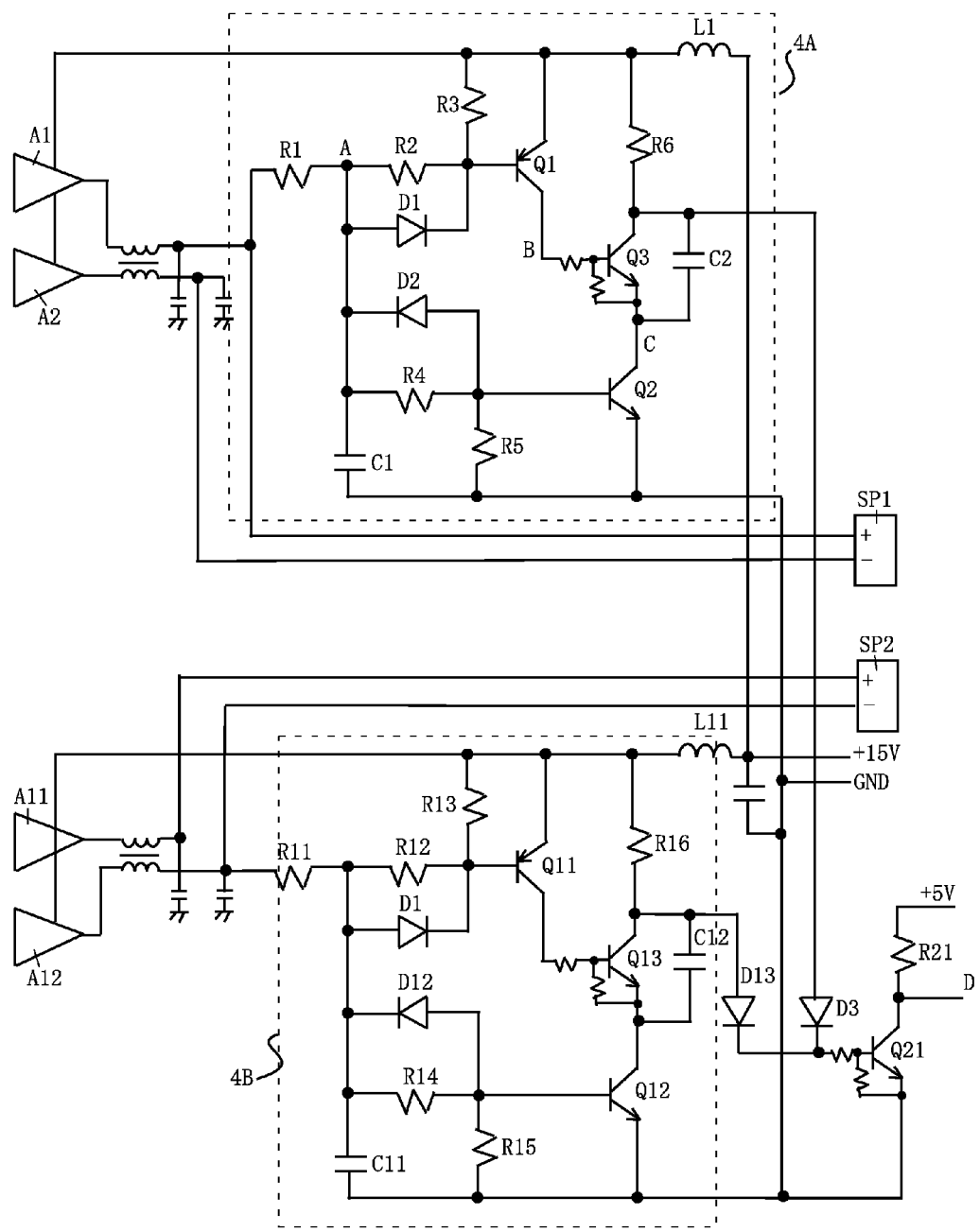
FIG. 2 is a circuit diagram illustrating a clip detecting circuit.

FIG. 2 is a circuit diagram illustrating the main amplifier 3, the clip detecting circuit 4, and the speaker. When the audio signal is a 2ch-signal including a left-channel audio signal and a right-channel audio signal, the clip detecting circuit 4 includes a left-channel clip detecting circuit 4A and a right-channel clip detecting circuit 4B. The main amplifier 3 includes left-channel amplifiers A1 (positive-side amplifier) and A2 (negative-side amplifier), and right-channel amplifiers A11 (positive-side amplifier) and A12 (negative-side amplifier). An audio signal from the left-channel amplifier A1 is input into a positive-side input terminal of the left speaker SP1, and an audio signal from the left-channel amplifier A2 is input into a negative-side input terminal of the left speaker SP1. An audio signal from the left-channel amplifier A1 is input into the left-channel clip detecting circuit 4A. An audio signal from the right-channel amplifier A11 is input into a positive-side input terminal of the right speaker SP2, and an audio signal from the right-channel amplifier A12 is input into a negative-side input terminal of the right speaker SP2. Further, an audio signal from the right-channel amplifier A12 is input into the right-channel clip detecting circuit 4B.

Since the left-channel clip detecting circuit 4A and the right-channel clip detecting circuit 4B have the same circuit configuration, only the left-channel clip detecting circuit 4A will be described below.

The clip detecting circuit 4A approximately includes resistors R2 and R3, a first detecting section (a transistor Q1), resistors R4 and R5, a second detecting section (a transistor Q2), and a synthesizing section (a transistor Q3). The resistors R2 and R3 determine the first set value. The first detecting section (a transistor Q1) detects whether the amplitude value of an output voltage of the main amplifier 3 is the first set value or more. The resistors R4 and R5 determine the second set value. The second detecting section (a transistor Q2) detect whether the amplitude value of the output voltage of the main amplifier 3 is less than the second set value. The synthesizing section (a transistor Q3) synthesizes a detected result of the first detecting section with a detected result of the second detecting section.

The transistor Q1 is a pnp type transistor, its emitter is connected to a +15 V power-supply line. A collector of the transistor Q1 is connected to a base of the transistor Q3, and its base is connected to a connecting point between the resistor R2 and the resistor R3. The transistor Q2 is an npn type transistor. An emitter of the transistor Q2 is connected to a ground potential, its collector is connected to an emitter of the transistor Q3, and its base is connected to a connecting point between the resistor R4 and the resistor R5. The transistor Q3 is an npn type transistor with built-in resistor. A base of the transistor Q3 is connected to the collector of the transistor Q1, and its collector is connected to the +15V power-supply line via the resistor R6.

A transistor Q21 is a transistor for, when at least one of a signal from the left-channel clip detecting circuit 4A and a signal from the right-channel clip detecting circuit 4B is a signal representing that the audio signal is clipped, supplying the signal representing that the audio signal is clipped to the microcomputer 5.

According to a user's operation and a signal from the clip detecting circuit 4, the microcomputer 5 sets the boost value, instructs the boost value set in the boost processing section 2, sets the volume level, and instructs the volume level set in the volume adjusting section 1. When the microcomputer 5 receives a signal representing that the audio signal is clipped (namely, the signal representing that the audio signal has the first set value or more, or the signal representing that the audio signal has less than the second set value) (for example, a low-level signal) from the clip detecting circuit 4 continuously for a predetermined time (for example, 5 milliseconds), the microcomputer 5 determines whether the set boost value is 0. When the boost value is not 0, the microcomputer 5 sets a value obtained by reducing a currently set boost value by a predetermined step (for example, 1 step) as a new boost value, and instructs the boost processing section 2 about the set boost value. On the other hand, when the boost value is 0, the boost value cannot be further reduced, and thus instead, the microcomputer 5 sets a value obtained by reducing the currently set volume level by a predetermined step (for example, 1 step) as a new volume level, and instructs the volume adjusting section 1 about the new volume level.

An operation of the tone control apparatus 10 having the above constitution will be described below.

Figure 3:
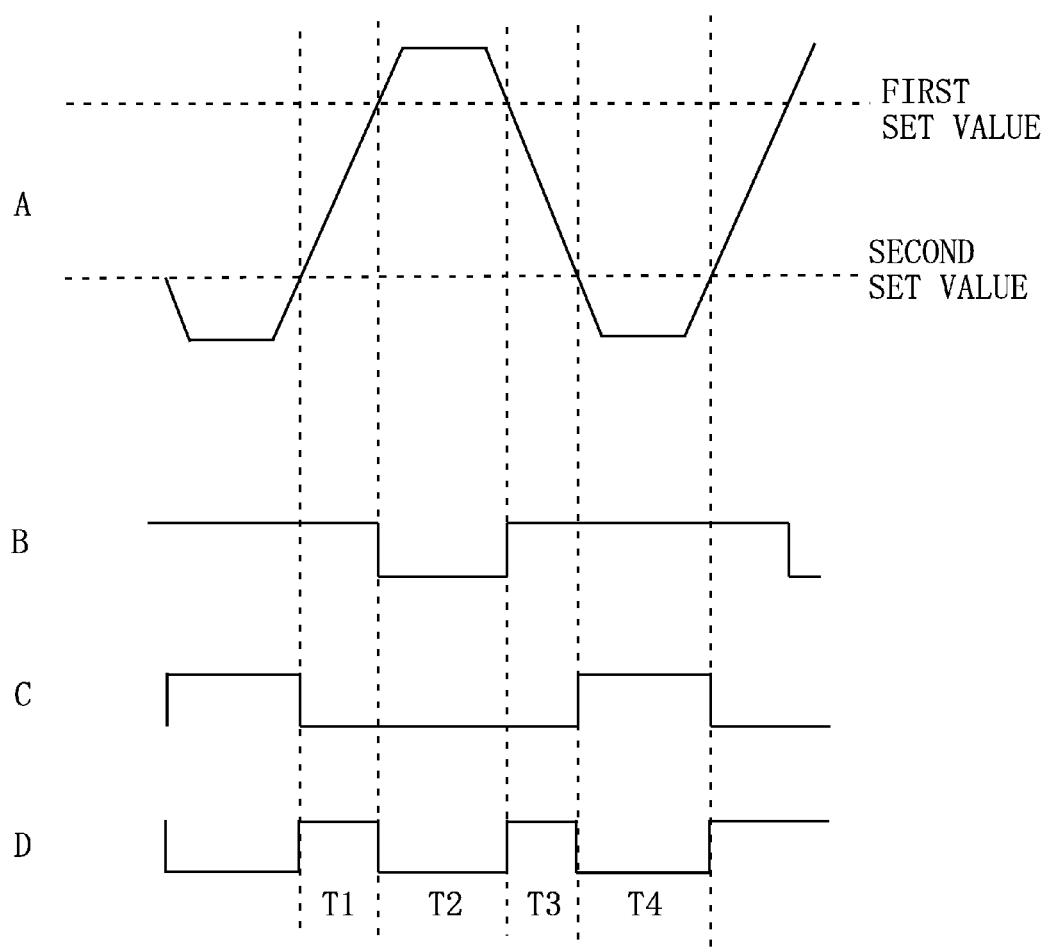
FIG. 3 is a time chart illustrating waveforms at respective points of the clip detecting circuit.

FIG. 3 is a time chart illustrating waveforms at respective points of the clip detecting circuit 4A, and respective symbols correspond to the waveforms at the respective points in FIG. 1. An operation of the right-channel clip detecting circuit 4B is similar. The right-channel clip detecting circuit 4B does not detect that the audio signal is the first set value or more nor that the audio signal is less than the second set value. Therefore, a collector voltage of a transistor Q13 is at low level, and a signal is not output to a base of a transistor Q21.

At period T1, the amplitude value of the output voltage of the main amplifier 3 is less than the first set value, and is the second set value or more (see A point voltage). Therefore, a base voltage of the transistor Q1 reaches a continuity start voltage and the transistor Q1 is in an ON state, a collector voltage is raised to a +15 V power-supply voltage, and a B point voltage is at a high level. On the other hand, a base voltage of the transistor Q2 reaches the continuity start voltage and the transistor Q2 is in the ON state, a collector voltage is reduced to a ground potential, and a C point voltage is at a low level. Since the B point voltage of the transistor Q3 is at the high level, a base voltage reaches the continuity start voltage and the transistor Q3 is in the ON state, and a collector voltage is reduced to a ground potential. A base voltage of the transistor Q21 is less than the continuity start voltage, and thus the transistor Q21 is in an OFF state. Therefore, the +5 V power-supply voltage that is a high-level signal representing that the audio signal is not clipped is output to the microcomputer 5. That is to say, a D point voltage is at the high level.

At period T2, the amplitude value of the output voltage of the main amplifier 3 is the first set value or more (see A point voltage). That is to say, it is considered that the amplitude of the audio signal is clipped on an upper side. The base voltage of the transistor Q1 does not reach the continuity start voltage and the transistor Q1 is in the OFF state, the collector is opened with respect to the +15V power-supply voltage, and the B point voltage is at the low level. On the other hand, the base voltage of the transistor Q2 reaches the continuity start voltage and the transistor Q2 is in the ON state, the collector voltage is reduced to the ground potential, and the C point voltage is at the low level. Since the B point voltage of the transistor Q3 is at low level, a base voltage of the transistor Q3 does not reach the continuity start voltage, the transistor Q3 is in the OFF state, and a collector voltage is raised to the +15V power-supply voltage. A collector voltage of the transistor Q3 is supplied to a base of the transistor Q21 via a diode D3. A base voltage of the transistor Q21 reaches of the continuity start voltage, and the transistor Q21 is in the ON state. Therefore, a ground potential as a low-level signal representing that the audio signal is clipped (the amplitude of the audio signal is the first set value or more) is output to the microcomputer 5. That is to say, the D point voltage is at the low level.

Since period T3 is the same as the period T1, the description about the period T1 will incorporate herein.

At period T4, the amplitude value of the output voltage of the main amplifier 3 is less than the second set value (see the A point voltage). That is to say, it is considered that the amplitude of the audio signal is clipped on a lower side. Therefore, the base voltage of the transistor Q1 reaches the continuity start voltage so that the transistor Q1 is in the ON state, the collector voltage is raised to the +15 power-supply voltage, and the B point voltage is at the high level. On the other hand, the base voltage of the transistor Q2 does not reach the continuity start voltage so that the transistor Q2 is in the OFF state, and since the collector is opened with respect to the ground potential, the C point voltage is at the high level similarly to the B point voltage. Since the B point voltage of the transistor Q3 is at the high level, the base voltage of the transistor Q3 reaches the continuity start voltage so that the transistor Q3 is in the ON state, and the collector voltage is at the high level. The collector voltage of the transistor Q3 is supplied to a base of the transistor Q21 via the diode D3. The base voltage of the transistor Q21 reaches the continuity start voltage so that the transistor Q21 is in the ON state. Therefore, the ground potential as a low-level signal representing that the audio signal is clipped (the amplitude of the audio signal is less than the second set value) is output to the microcomputer 5. That is to say, the D point voltage is at the low level.

Figure 4:
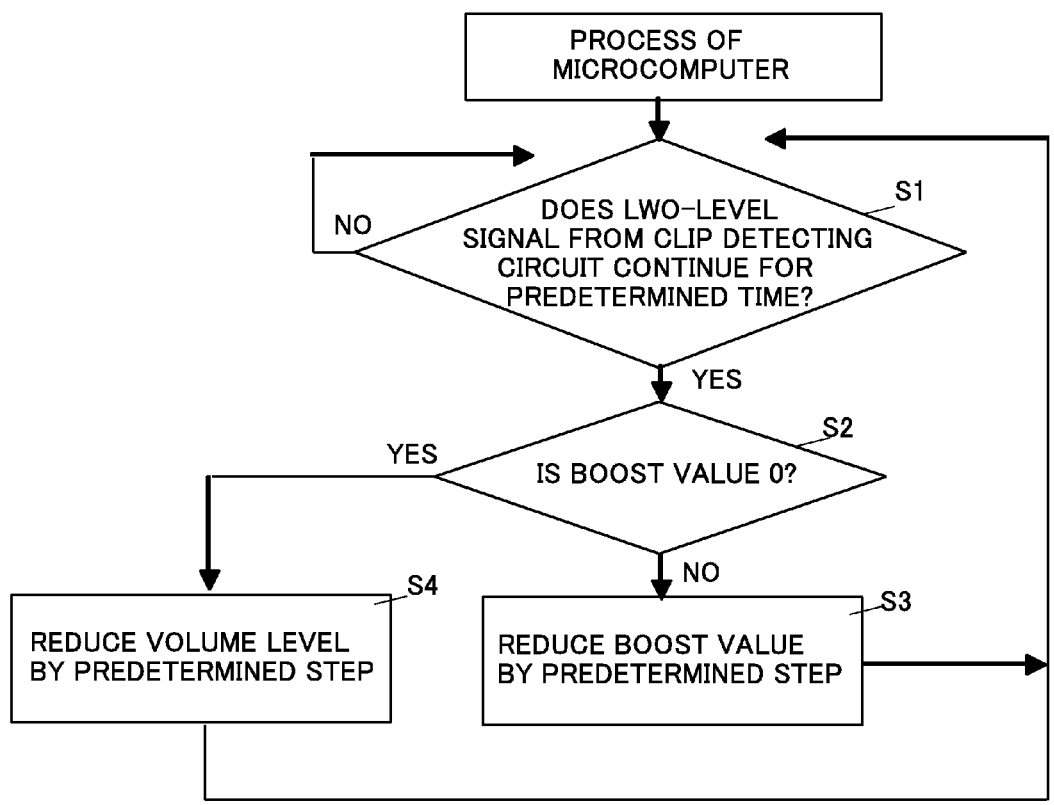
FIG. 4 is a flowchart illustrating a process of a microcomputer (a control section)

FIG. 4 is a flowchart illustrating a process of the microcomputer 5. The microcomputer 5 determines whether the signal representing that the audio signal is clipped (the low-level signal) is received from the clip detecting circuit 4 continuously for predetermined time (5 milliseconds) or more (S1).

When the low-level signal is received continuously for 5 milliseconds (YES at S1), the microcomputer 5 determines whether the set boost value is 0 (S2). When the boost value is not 0 and the boost processing section 2 executes the boost process on the set boost value (NO at S2), the microcomputer 5 reduces the currently set boost value by a predetermined step (for example, 1 step), sets a new boost value, and instructs the boost processing section 2 about the set boost value (S3). The boost processing section 2 executes the boost process based on the new boost value instructed by the microcomputer 5. Therefore, the amplitude value of the audio signal from the main amplifier 3 can be reduced, so that the audio signal can be prevented from being clipped in advance. For example, when the currently set boost value is 3, 2 is set as the new boost value.

Thereafter, again at S1, the microcomputer 5 determines whether the signal (the low-level signal) representing that the audio signal is clipped is received from the clip detecting circuit 4 continuously for predetermined time (5 milliseconds) (S1). When the low-level signal is still received from the clip detecting circuit 4 continuously for 5 milliseconds even if the boost value is reduced by 1 step, the sequence goes to S3 again via S2. That is to say, the boost value is sequentially reduced by each 1 step every 5 milliseconds as long as the low-level signal is continued to be received from the clip detecting circuit 4.

When the boost value is 0 at S2 (YES at S2), the set boost value cannot be reduced, and thus instead, the microcomputer 5 reduces the currently set volume level by a predetermined step (for example, 1 step) so as to set a new volume level, and instructs the volume adjusting section 1 about the set volume level (S4). The volume adjusting section 1 adjusts the volume level of the audio signal based on the new volume level instructed by the microcomputer 5. Therefore, the amplitude value of the audio signal from the main amplifier 3 can be reduced, and the audio signal can be prevented from being clipped in advance. For example, when the currently set volume level is 30, 29 is set as a new volume level.

Examples of the case where the set boost value is 0 include a case where the boost value is set to 0 by a user's operation, and a case where the boost value is sequentially reduced one step by one step by repeating steps S1, S2 and S3, and finally the boost value becomes 0.

Thereafter, again at S1, the microcomputer 5 determines whether the signal (the low-level signal) representing that the audio signal is clipped is received from the clip detecting circuit 4 continuously for predetermined time (5 milliseconds) (S1). When the low-level signal is still received from the clip detecting circuit 4 continuously for 5 milliseconds even if the volume level is reduced by 1 step, the sequence goes to S4 again via S2. That is to say, the volume level is sequentially reduced one step by one step every 5 milliseconds as long as the low-level signal is continued to be received from the clip detecting circuit 4.

According to the embodiment, the amplitude value of the output voltage of the main amplifier 3 is always monitored, and when amplitude value is the first set value or more, or less than the second set value, the boost value is reduced. When the boost value cannot be further reduced, the volume level is reduced, thereby securely preventing the output voltage of the main amplifier 3 from being clipped.

The process of the microcomputer according to another embodiment of the present invention will be described below. In this embodiment, instead of reducing the boost value until the boost value becomes 0 and reducing the volume level after the boost value becomes 0, the microcomputer reduces the boost value until the boost value becomes the predetermined value (for example, 2) and reduces the volume level after the boost value becomes the predetermined value. As a result, while the boost process is being executed with a certain boost value, the output voltage of the main amplifier 3 can be securely prevented from being clipped.

Figure 5:
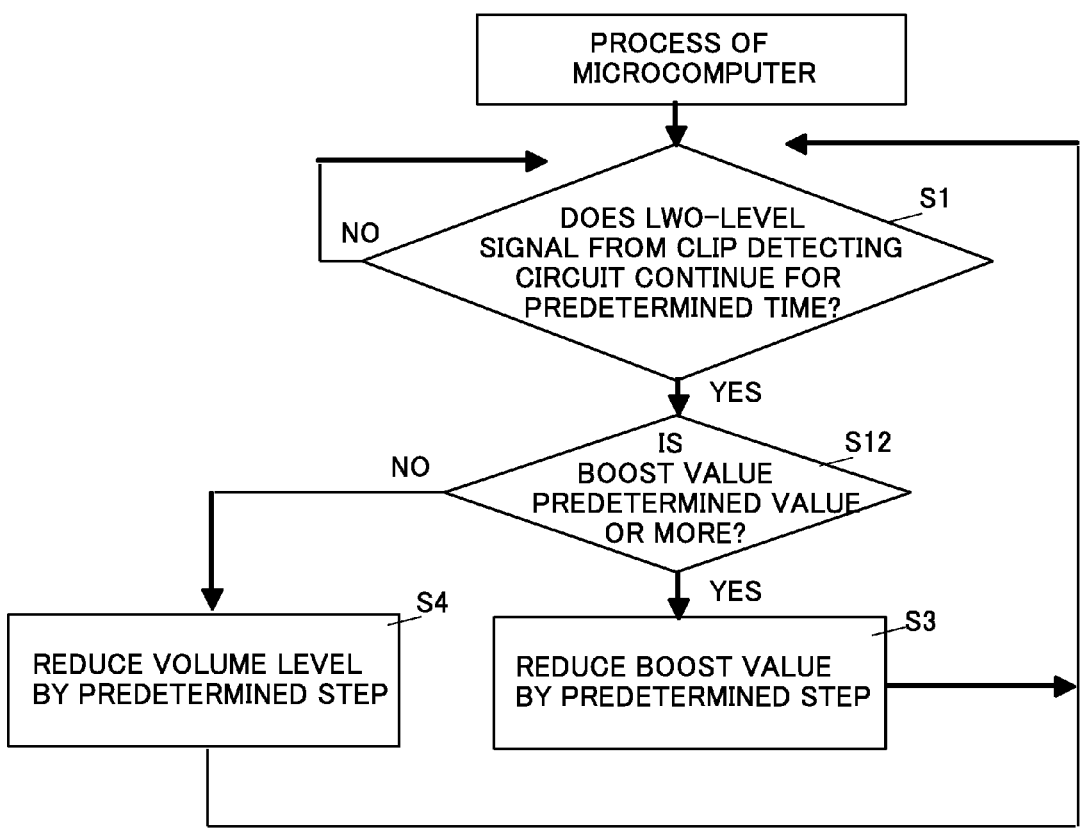
FIG. 5 is a flowchart illustrating a process of the microcomputer (the control section)

FIG. 5 is a flowchart illustrating a process according to the embodiment. The microcomputer 5 determines whether the signal (the low-level signal) representing that the audio signal is clipped is received from the clip detecting circuit 4 continuously for predetermined time (5 milliseconds) (S1).

When the low-level signal is received continuously for 5 milliseconds (YES at S1), the microcomputer 5 determines whether the set boost value is the predetermined value (for example, 3) or more (S12). When the boost value is the predetermined value or more (YES at S12), the microcomputer 5 reduces the currently set boost value by a predetermined step (for example, 1 step), sets a new boost value, and instructs the boost processing section 2 about the set boost value (S3). The boost processing section 2 executes the boost process based on the new boost value instructed by the microcomputer 5. Therefore, the amplitude value of the audio signal from the main amplifier 3 can be reduced, and thus the audio signal can be prevented from being clipped in advance. For example, when the currently set boost value is 5, 4 is set as the new boost value.

Thereafter, again at S1, the microcomputer 5 determines whether the signal (the low-level signal) representing that the audio signal is clipped is received from the clip detecting circuit 4 continuously for predetermined time (5 milliseconds) (S1). When the low-level signal is further received from the clip detecting circuit 4 for 5 milliseconds even if the boost value is reduced by 1 step, the sequence goes to S3 again via S12. That is to say, the boost value is sequentially reduced one step by one step every 5 milliseconds as long as the low-level signal is continued to be received from the clip detecting circuit 4.

When the boost value is less than the predetermined value at S12 (NO at S12), the microcomputer 5 reduces the currently set volume level by a predetermined step (for example, 1 step), sets a new volume level, and instructs the volume adjusting section 1 about the set volume level (S4). The volume adjusting section 1 adjusts the volume level of the audio signal based on the new volume level instructed by the microcomputer 5. Therefore, the amplitude value of the audio signal from the main amplifier 3 can be reduced, so that the audio signal can be prevented from being clipped in advance. For example, when the currently set volume level is 30, 29 is set as the new volume level.

Examples of the case where the set boost value is less than the predetermined value include a case where the boost value is set to be less than the predetermined value by a user's operation, and a case where the boost value is sequentially reduced one step by one step by repeating steps S1, S12 and S3 so that finally the boost value is less than the predetermined value.

Thereafter, again at S1, the microcomputer 5 determines whether the signal (the low-level signal) representing that the audio signal is clipped is received from the clip detecting circuit 4 continuously for predetermined time (5 milliseconds) (S1). When the low-level signal is still received from the clip detecting circuit 4 continuously for 5 milliseconds even if the volume level is reduced by 1 step, the sequence goes to S4 again via S12. That is to say, the volume level is sequentially reduced one step by one step every 5 milliseconds as long as the low-level signal is continuously received from the clip detecting circuit 4.

Figure 6:
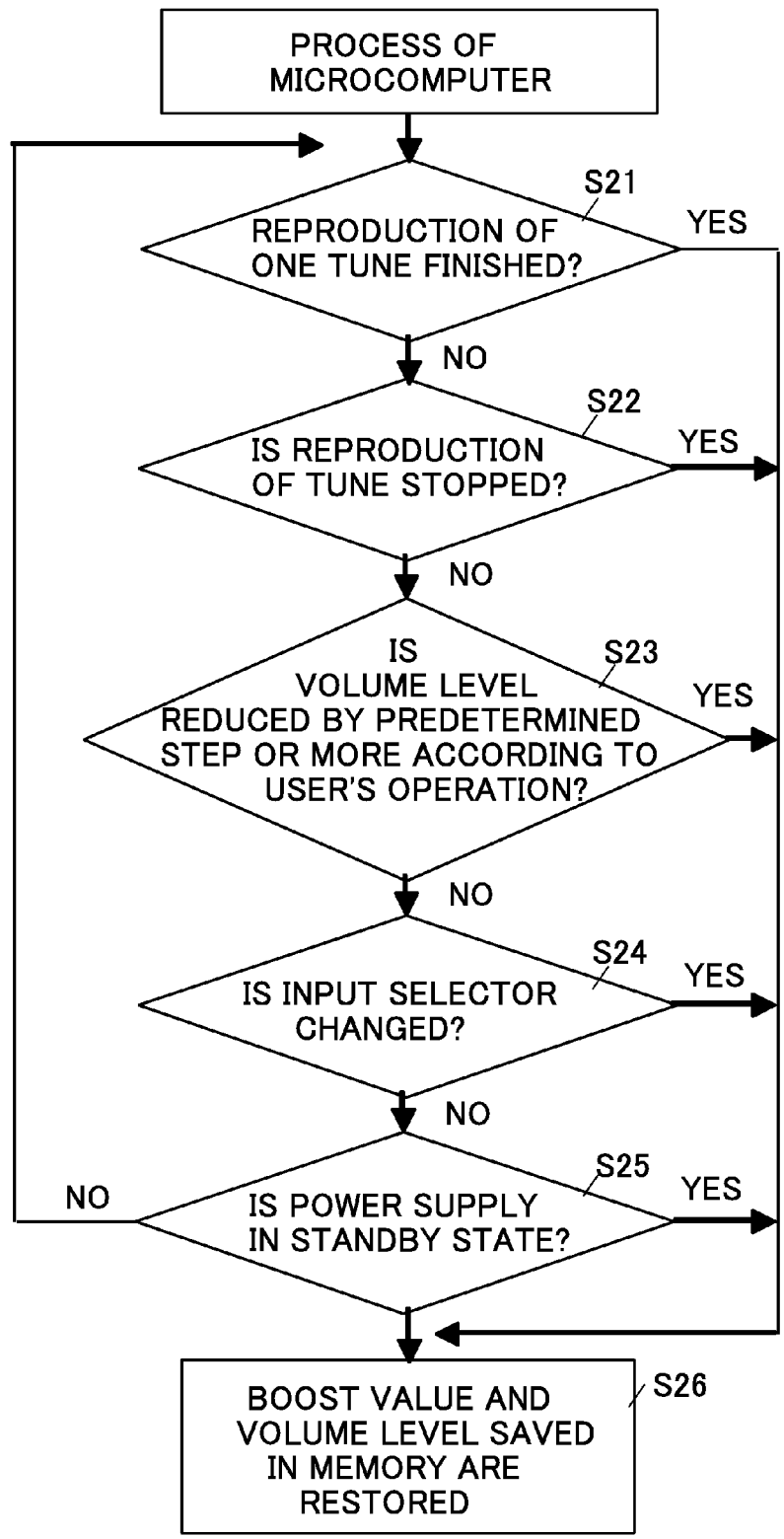
FIG. 6 is a flowchart illustrating a process of the microcomputer (the control section)
Figure 7A:
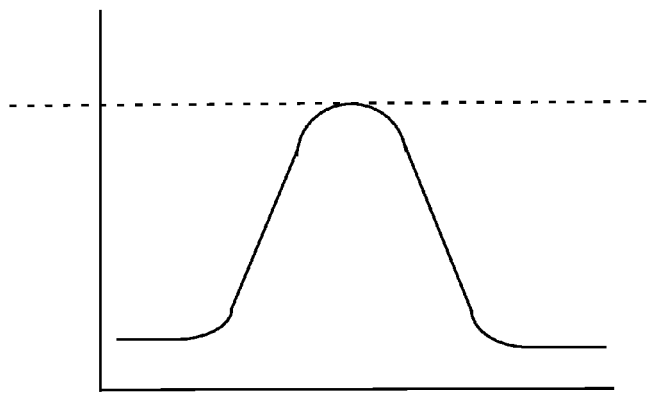
FIGS. 7A to 7C are diagrams describing states that an audio signal is clipped.
Figure 7B:
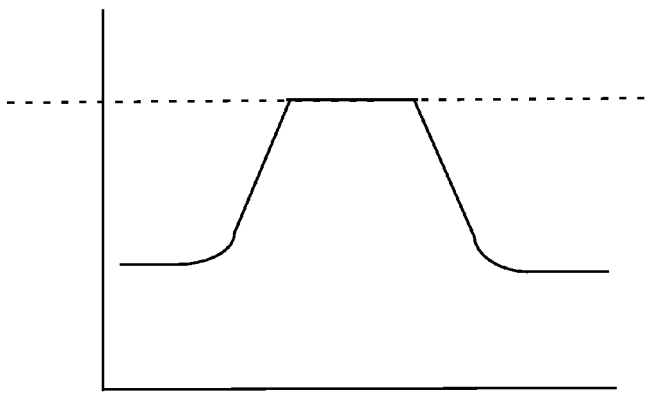
Figure 7C:
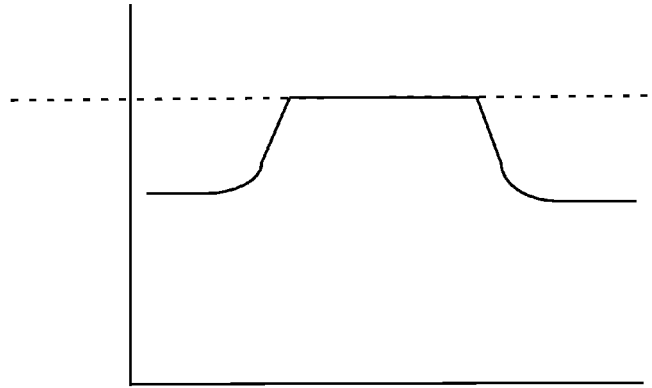

Still another embodiment of the present invention will be described below. FIG. 6 is a flowchart illustrating the process according to the embodiment. In the above embodiments, when the determination is firstly made as YES at S1, the microcomputer 5 saves the boost value and the volume level currently set by the user's operation in a memory, not shown. The microcomputer 5 determines whether reproduction of an audio signal for one tune (namely, one content) is completed (S21). When the reproduction of the audio signal for one tune is completed (YES at S21), the microcomputer 5 brings the boost value and the volume level that are set by the user's operation and are saved in the memory back to the setting state (S26). The microcomputer determines whether an instruction for stopping the reproduction of the tune (audio signal) is input by a user's operation (S22). When the instruction for stopping the reproduction is input (YES at S22), the microcomputer 5 brings the boost value and the volume level that are set by the user's operation and are saved in the memory back to the setting state (S26).

The microcomputer 5 determines whether the volume level is reduced by predetermined steps (for example, 10 steps) or more by a user's operation (S23). When the volume level is reduced by the predetermined steps or more by the user's operation (YES at S23), the microcomputer 5 brings the boost value and the volume level that are set by the user's operation and are saved in the memory back to the setting state (S26). The microcomputer 5 determines whether an input selector is changed (S24). For example, when a CD player and a DVD player are connected to an audio device using the tone control apparatus 10, a determination is made whether the device from which the audio signal is input to the tone control apparatus 10 is switched into the CD player or the DVD player. When the input selector is changed (YES at S24), the microcomputer 5 brings the boost value and the volume level that are set by the user's operation and are saved in the memory back to the setting state (S26). The microcomputer 5 determines whether the power supply is brought into an OFF state (standby state) (S25). When the power supply is brought into the OFF state (standby state) (YES at S25), the microcomputer 5 brings the boost value and the volume level that are set by the user's operation and are saved in the memory back to the setting state (S26).

The microcomputer 5 determines at S21 to S25 whether the currently input audio signal is not input, and when the audio signal is not input, it brings the boost value and the volume level that are set by the user's operation and are saved in the memory back to the setting state. As a result, the boost value and the volume level do not have to be reset to original values by the user's operation.

Side working effects according to the above embodiments will be described below. In conventional audio amplifiers, the amplitude value of an audio signal to be input is small, and thus when a volume of a sound to be output is low, the setting is changed so that sensitivity of DSP is heightened by a user's operation. When the amplitude value of an audio signal to be input is large and thus the audio signal is clipped by a power-supply voltage, the setting should be changed so that the sensitivity of DSP is reduced by a user's operation. Therefore, the user's operations are complicated. Moreover, when improper setting is carried out, the volume of the sound becomes very low, or the audio signal is clipped so that a noise is generated.

On the contrary, according to the above embodiments of the present invention, the sensitivity of DSP does not have to be switched by a user's operation, and the boost value and the volume level are reduced according to the amplitude value of an audio signal to be input. For this reason, an operation similar to an automatic change in the sensitivity of DSP can be performed.

The preferred embodiments of the present invention were described above, but the present invention is not limited to these embodiments. As an another embodiment, a constitution where the clip detecting circuit 4 detects only whether the audio signal has the first set value or more, and where the clip detecting circuit 4 does not detect whether the audio signal has less than the second set value may be employed. In this case, in FIG. 2, the resistors R4 and R5, the transistor Q2 and the like are omitted. On the contrary, a constitution where the clip detecting circuit 4 detects only whether an audio signal has less than the second set value, and where the clip detecting circuit 4 does not detect whether the audio signal has the first set value or more may be employed. In this case, in FIG. 2, the resistors R2 and R3, the transistor Q1 and the like are omitted. Polarities of the respective transistors are not limited to the above embodiments. That is to say, in the time chart of FIG. 3, the high level and the low level may be reversed. When an AC-DC converter is used as the power supply in the present invention, an overcurrent can be prevented from being protected, and thus this case is effective.

What is claimed is:

1. A tone control apparatus, comprising:
   a volume adjusting section for adjusting a volume level of an audio signal to a volume level set by a control section;
   a boost processing section for executing a boost process so that a boost band of the audio signal has a boost value set by the control section;
   an amplifying section for amplifying the audio signal via the volume adjusting section and the boost processing section;
   a detecting section for detecting whether the audio signal output from the amplifying section has a first set value or more, and when the audio signal has the first set value or more, outputting a signal representing that the audio signal has the first set value or more to the control section; and
   the control section for, when receiving the signal representing that the audio signal has the first set value or more from the detecting section, determining whether the set boost value is a predetermined value or more, and when the set boost value is the predetermined value or more, reducing the currently set boost value by a predetermined step so as to set a new boost value, and when the set boost value is less than the predetermined value, reducing the currently set volume level by a predetermined step so as to set a new volume level.

2. The tone control apparatus according to claim 1, wherein when the control section receives the signal representing that the audio signal has the first set value or more from the detecting section continuously for predetermined time, the control section determines whether the set boost value is a predetermined value or more.

3. The tone control apparatus according to claim 1, wherein when the control section receives the signal representing that the audio signal has the first set value or more from the detecting section, the control section determines whether the set boost value is 0, and when the set boost value is not 0, the control section reduces the currently set boost value by a predetermined step so as to set a new boost value, and when the currently set boost value is 0, reduces the currently volume level by a predetermined step so as to set a new volume level.

4. The tone control apparatus according to claim 1, wherein the detecting section further detects whether the audio signal output from the amplifying section has less than a second set value smaller than the first set value, and when the audio signal has less than the second set value, the detecting section outputs a signal representing that the audio signal has less than the second set value to the control section, when the control section receives the signal representing that the audio signal has less than the second set value from the detecting section, the control section determines whether the set boost value is a predetermined value or more, and when the set boost value is the predetermined value or more, the control section reduces the currently set boost value by a predetermined step so as to set a new boost value, and when the set boost value is less than the predetermined value, the control section reduces the currently set volume level by a predetermined step so as to set a new volume level.

5. The tone control apparatus according to claim 4, wherein when the control section receives the signal representing that the audio signal has less than the second set value from the detecting section, the control section determines whether the set boost value is 0, when the set boost value is not 0, the control section reduces the currently set boost value by a predetermined step so as to set new boost value, and when the set boost value is 0, the control section reduces the currently set volume level by a predetermined step so as to set a new volume level.

6. The tone control apparatus according to claim 1, wherein when the control section reduces the boost value currently set by a user's operation by the predetermined step so as to set the new boost value, the control section stores the boost value set by the user's operation in a storage section, and when the control section reduces the volume level currently set by the user's operation by the predetermined step so as to set the new volume level, the control section stores the volume level set by the user's operation in the storage section, and when the currently input audio signal is not input, the control section brings the boost value and the volume level stored in the storage section back to a setting state.

7. A tone control apparatus, comprising:
a volume adjusting section for adjusting a volume level of an audio signal to a volume level set by a control section;
a boost processing section for executing a boost process so that a boost band of the audio signal has a boost value set by the control section;
an amplifying section for amplifying the audio signal via the volume adjusting section and the boost processing section;
a detecting section for detecting whether the audio signal output from the amplifying section has less than a second set value, and when the audio signal has less than the second set value, outputting a signal representing that the audio signal has less than the second set value to the control section; and
the control section, for when receiving the signal representing that the audio signal has less than the second set value, determining whether the boost value is a predetermined value or more, and when the set boost value is the predetermined value or more, reducing the currently set boost value by a predetermined step so as to set a new boost value, and when the set boost value is less than the predetermined value, reducing the currently set volume level by a predetermined step so as to set a new volume level.

8. A tone control apparatus, comprising:
a volume adjusting section for adjusting a volume level of an audio signal to a volume level set by a control section;
a boost processing section for executing a boost process so that a boost band of the audio signal has a boost value set by the control section;
an amplifying section for amplifying the audio signal via the volume adjusting section and the boost processing section;
a detecting section for detecting whether the audio signal output from the amplifying section has a first set value or more, and when the audio signal has the first set value or more, outputting a signal representing that the audio signal has the first set value or more to the control section; and
the control section for, when receiving the signal representing that the audio signal has the first set value or more, determining whether the set boost value is 0, and when the set boost value is not 0, reducing the currently set boost value by a predetermined step so as to set a new boost value, and when the set boost value is 0, reducing the currently set volume level by a predetermined step so as to set a new volume level.

* * * * *